United States Patent [19]

Ueno

[11] Patent Number: 6,136,727
[45] Date of Patent: Oct. 24, 2000

[54] METHOD FOR FORMING THERMAL OXIDE FILM OF SILICON CARBIDE SEMICONDUCTOR DEVICE

[75] Inventor: Katsunori Ueno, Kanagawa, Japan

[73] Assignee: Fuji Eletric Co., Ltd., Japan

[21] Appl. No.: 09/216,577

[22] Filed: Dec. 18, 1998

[30] Foreign Application Priority Data

Dec. 19, 1997 [JP] Japan .................................. 9-350329

[51] Int. Cl.$^7$ ................................................. H01L 21/31
[52] U.S. Cl. .......................................... 438/770; 438/770
[58] Field of Search ............................ 438/99, 770, 769, 438/767, 773, 774, 765, 478, 479

[56] References Cited

U.S. PATENT DOCUMENTS

| 5,363,800 | 11/1994 | Larkin et al. | 117/95 |
| 5,759,908 | 6/1998 | Steckl et al. | 438/479 |
| 5,915,194 | 6/1999 | Powell et al. | 438/478 |

OTHER PUBLICATIONS

K. Ueno, "Effects of the Cooling–off Condition on the Oxidation Process in 6H–SiC", Sep. 1997, Paper presented at the 7th Int. Conf. on Silicon Carbide,III–Nitrides & Related Materials, Stockholm, Sweden.

H. Tsuchida et al., "FTIR–ATR Analysis of SiC(000T) and SiC(0001) Surfaces", Aug. 31–Sep. 5, 1997, Int. Conf. on Silicon Carbide, III–Nitrides and Related Materials–1997 (ICSC III–N' 97), Stockholm, Sweden.

C.M. Zetterling, "The Influence of Dry Cleaning Technique on Thermal Oxides Grown on 4H and 6H p–type SiC", 1996, p. 605–608, Inst. Phys, Conf. Ser. No 142:Chapter 3, IOP Publishing Ltd.

*Primary Examiner*—David Nelms
*Assistant Examiner*—D. Nhu
*Attorney, Agent, or Firm*—Rossi & Associates

[57] ABSTRACT

In a method for forming a thermal oxide film of a silicon carbide semiconductor device, a preliminary treatment is conducted in which a silicon carbide substrate is heated to 800 to 1200° C., in an atmosphere comprising hydrogen or a mixture of hydrogen and inert gas, and then a silicon dioxide film is formed on the substrate by thermal oxidation. A slight amount of hydrochloric acid gas may be added to the atmosphere for the preliminary treatment.

10 Claims, 3 Drawing Sheets

METHOD FOR FORMING THERMAL OXIDE FILM OF SILICON CARBIDE SEMICONDUCTOR DEVICE

FIELD OF THE INVENTION

The present invention relates to a method for forming a thermal oxide film of a silicon carbide semiconductor device using silicon carbide as a semiconductor material and having a MOS (metal-oxide film—semiconductor) structure.

BACKGROUND OF THE INVENTION

Silicon carbide (that will be referred to as SiC) has a wide band gap, and its maximum dielectric breakdown electric field is larger than that of silicon by one order of magnitude. Thus, SiC has been highly expected to be used as a material for power semiconductor devices in the next generation. SiC is known as having crystalline polymorphism, namely, SiC crystallizes into two or more forms having different structures. In these days, single crystals, such as 6H-SiC and 4H-SiC, are being manufactured with sufficiently high quality. These crystals are alpha-phase SiC in which a zinc-blend structure and a wurtzite structure are superposed on each other.

Up to the present, various types of semiconductor devices, including Shottky diodes, vertical MOSFET, and thyristors, have been fabricated, and it has been confirmed that these devices exhibit better characteristics than conventional Si devices. In particular, 4H-SiC crystal is most expected to be applied to power devices, because the mobility of carriers in the 4H-SiC crystal has least dependence on its crystal orientation, and is higher than those of other forms of SiC.

Recently, MOS type semiconductor devices utilizing the MOS structure have been widely used as silicon semiconductor devices. In manufacturing the MOS type devices, a silicon substrate is exposed to an oxidizing atmosphere containing, for example, oxygen or water vapor, at a high temperature of 1000° C. to 1200° C., so as to form a silicon dioxide film (that will be referred to as "$SiO_2$ film") on the surface of the substrate through the thermal oxidation. The $SiO_2$ film thus formed is used as an insulating film.

In a similar method of thermal oxidation as used in the case of silicon, an $SiO_2$ film can be grown on the surface of the SiC substrate, to provide an excellent semiconductor-insulator interface, as known in the art. Since the $SiO_2$ film can be used as a gate insulating film or a stabilizing film, SiC may be similarly applied to MOS type semiconductor devices. This characteristic, i.e., formation of a favorable $SiO_2$ film, is not generally observed in other compound semiconductors, and therefore can be advantageously utilized to easily manufacture MOS type semiconductor devices, such as MOSFET. Thus, SiC is expected to be used in a wide range of applications in the future.

A typical example of oxidizing process will be now explained. FIG. 5 is a graph representing a temperature program, which shows changes in the temperature during the typical oxidizing process. In FIG. 5, the horizontal axis indicates time, and the vertical axis indicates the temperature. Initially, a wafer is introduced into an oxidizing furnace at a temperature $T_2$ that is lower than an oxidizing temperature, and the temperature of the furnace is then raised to the oxidizing temperature $T_3$. Thereafter, the wafer is oxidized at the temperature $T_3$ for a period of time $t_2$. In this oxidizing process, an oxidizing atmosphere in the form of steam, or wet oxygen containing water vapor, or dry oxygen containing no water vapor, flows through the oxidizing furnace. After the oxidizing process, the wafer is subjected to an annealing process in suitable gas, at the same temperature as the oxidizing temperature, or other temperature, and then the furnace is cooled down. In the final step, the wafer is taken out of the furnace at a temperature $T_4$. In the manufacturing process of silicon semiconductor devices, annealing in an inert gas, such as nitrogen or argon, is generally needed so as to lower the interface state density, for example. In FIG. 5, $t_3$ represents a period of time for which annealing is conducted. Although the annealing temperature is equal to the oxidizing temperature in the above example, these temperatures may be different from each other.

As described above, an $SiO_2$ film is grown on SiC by a similar method of thermal oxidation as employed for silicon. The $SiO_2$ film and SiC provides a clean interface, and the $SiO_2$ film grown on the SiC substrate can be used as a protective film or a gate insulating film of a MOS type semiconductor device.

Where the $SiO_2$ film is formed on the SiC substrate through thermal oxidation, however, the interface state density between the $SiO_2$ film and the SiC substrate is considerably higher than that of the silicon substrate, as reported in many publications (for example, Shenoy, J. N. et al.: J. of Electron Materials, Vol. 24, (1995) p.303). Such a high interface state density is fatal or detrimental to the MOS type semiconductor device that controls carried in a portion of the substrate that is very close to its surface. In this situation, several attempts have been made so as to lower the interface state density between the $SiO_2$ film formed by thermal oxidization, and the SiC substrate.

For example, the inventors of the present invention found that the interface state density is significantly lowered, and the channel mobility of the MOSFET is improved, by employing a method in which the SiC wafer is exposed to an atmosphere consisting of water vapor during a cooling period after the thermal oxidation (as reported in Proceedings of International Conference on Silicon Carbide, III-nitrides and Related Materials-1997).

The characteristics of the interface may be improved by other methods in which the wafer is exposed to oxygen plasma or irradiated with ultraviolet rays as a preliminary treatment prior to oxidation (as reported by Zetterling C. M. et al.: Proceedings of the Sixth Internal Conference on Silicon Carbide and Related Materials 1995, Institute of Physics Conference Series Number 142, p.605).

Although the mobility of carriers in the 4H-SiC crystal has small dependence on the crystal orientation, and the 4H-SiC crystal provides a higher mobility than other crystal forms, currently available MOSFET using the 4H-SiC crystal does not have satisfactory characteristics. This is because the channel mobility of the MOSFET using the 4H-SiC crystal is considerably small, even though the mobility in a bulk of 4H-SiC crystal is relatively high. There have been no reliable report concerning the mobility or methods for improving the mobility.

The high interface state density arising when the thermal oxide film is formed on the surface of the SiC substrate is considered as one reason for the considerably small channel mobility. Thus, the channel mobility is expected to be improved by providing a desirable interface between the thermal oxide film and the SiC substrate.

SUMMARY OF THE INVENTION

It is therefore an object of the present invention to provide a method for forming a thermal oxide film, which method achieves a large value of channel mobility as one of the most important characteristics of a semiconductor device, thereby to provide a silicon carbide semiconductor device having excellent characteristics.

To accomplish the above object, the present invention provides a method for forming a thermal oxide film of a silicon carbide semiconductor device, comprising the steps of: conducting a preliminary treatment in which a silicon carbide substrate is heated in an atmosphere comprising hydrogen; and, after the preliminary treatment, heating the silicon carbide substrate in an oxidizing atmosphere so as to grow a silicon dioxide film on a surface of the substrate. The atmosphere in which the preliminary treatment is conducted may be pure hydrogen, or a mixture of hydrogen gas and insert gas.

By conducting the preliminary treatment as described above, the channel mobility can be improved particularly when a low electric field is applied to the gate of the semiconductor device, as described later, thought the mechanism for the improved mobility has not been clarified.

The atmosphere in which the preliminary treatment is conducted may further contain hydrochloric acid gas. In this case, too, the channel mobility is improved.

The content of the hydrochloric acid gas is preferably controlled to be 5% or less of hydrogen. In this case, the channel mobility is improved, and etch pits do not appear on the surface of the substrate if the content is 5% or less.

The heating temperature of the preliminary treatment is preferably controlled to be in a range of 800 to 1200° C. With the temperature controlled to within this range, the channel mobility is improved. A noticeable effect may not be observed if the heating temperature is less than 800° C. and etch pits appear if the temperature exceeds 1200° C.

In the preliminary treatment, the silicon carbide substrate is preferably heated for five minutes or longer. If the heating period is less than 5 minutes, a noticeable effect cannot be observed.

Also, the silicon carbide substrate is preferably a 4H-SiC or 6H-SiC crystal. High-quality 4H-SiC or 6H-SiC crystals are available, and may be suitably used for semiconductor devices.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

A method of increasing the channel mobility as an important characteristic of a MOS type semiconductor device was developed by carefully studying a preliminary process conducted before thermal oxidization. A method for forming a thermal oxide film of a silicon carbide semiconductor device according to the present invention, which utilizes pyrogenic oxidation, will be described in detail, referring to the accompanying drawings. In the pyrogenic oxidation, hydrogen and oxygen gases are introduced, and caused to react with each other to produce water, so as to provide a wet atmosphere.

First Embodiment

Figure 1:
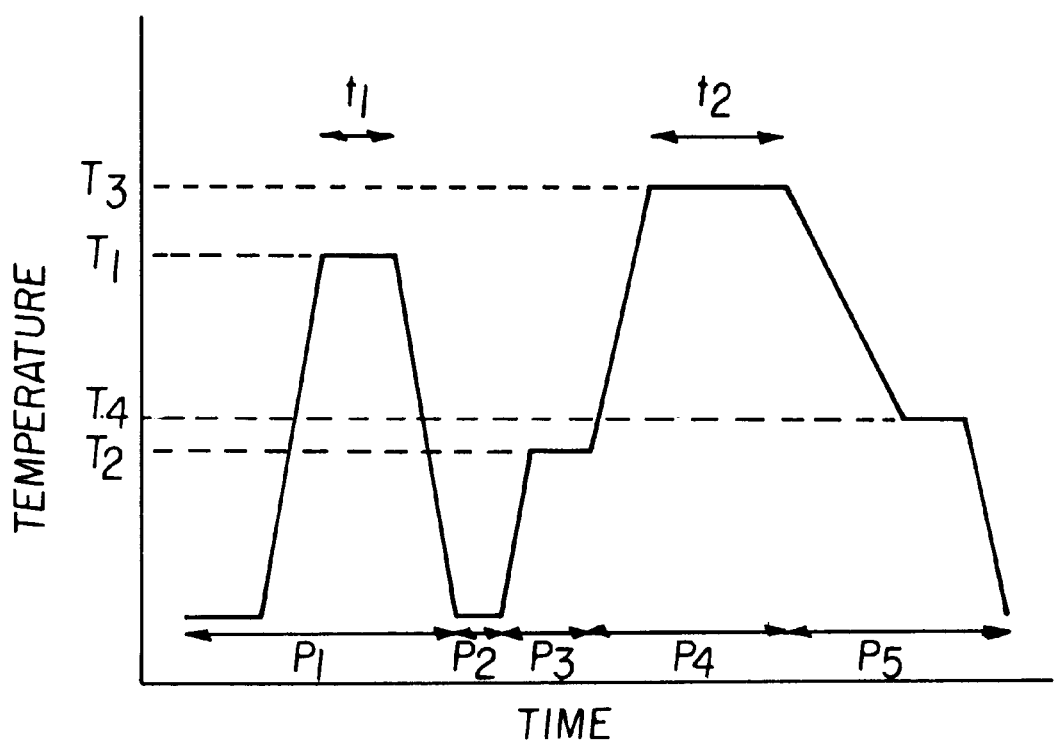
FIG. 1 is a graph representing a temperature program of the first embodiment of the present invention.

FIG. 1 represents a temperature program showing changes in the temperature during the oxidation process of the present invention, wherein the horizontal axis indicates time, and the vertical axis indicates the temperature.

Initially, a preliminary process according to the present invention is conducted for a period of time $P_1$. In this process, a specimen (SiC wafer) is surrounded by an atmosphere different from that used in an oxidizing process. In FIG. 1, $T_1$ indicates a temperature at which the preliminary treatment is conducted, and $t_1$ indicates a period of time for which the specimen is subjected to the preliminary treatment. In the next period $P_2$, the specimen is taken out of a furnace, and kept at room temperature. In the following period $P_3$, the specimen is set in an oxidizing furnace, and heated to a temperature $T_2$. Although not related to the principle of the present invention, this temperature $T_2$ is generally in a range of 700° C. to 900° C.

In the oxidation period $P_4$, thermal oxidation is conducted in an oxidizing atmosphere. The oxidizing atmosphere may be a dry oxygen atmosphere or a wet oxygen atmosphere. The oxidation time $T_4$ is determined depending upon a required thickness of the oxide film. In the following period $P_5$, the specimen is cooled down to a temperature $T_4$, in a suitable atmosphere, under appropriate conditions, and then taken out of the furnace to be further cooled down to room temperature. Although not related to the principle of the present invention, the temperature $T_4$ at which the specimen is taken out of the furnace is controlled to be in the range of 700° C. to 900° C., so as to reduce the interface state density.

Figure 5:
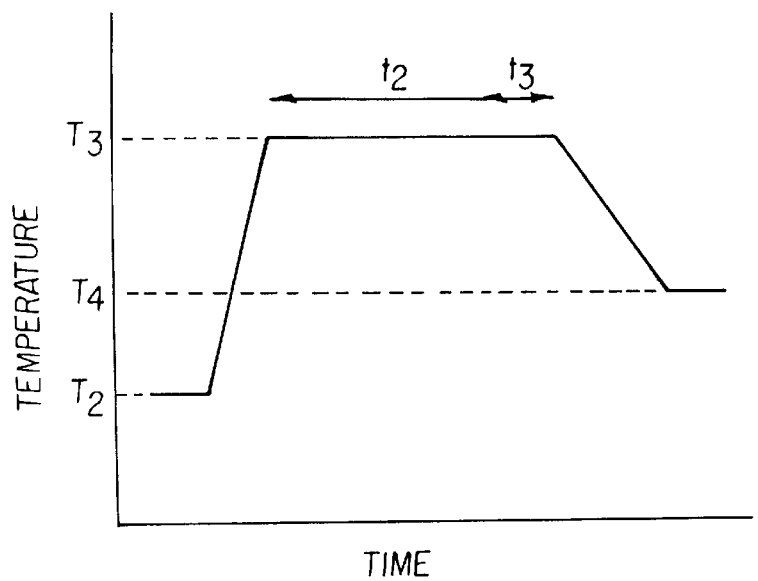
FIG. 5 is a graph representing a temperature program of conventional thermal oxidation.

In the method as shown in FIG. 1, the specimen is taken out of a furnace after it is treated with hydrogen, and then oxidized in a separate oxidizing furnace. Namely, the conventional oxidizing method as shown in FIG. 5 is preceded by a process of holding the wafer at the pretreatment temperature $T_1$ lower than the oxidizing temperature $T_3$, in a hydrogen ($H_2$) atmosphere, for the period of time $t_1$.

More specifically, the oxide film may be formed under the following conditions.

A SiC wafer is inserted into a pretreatment furnace kept at room temperature, and the furnace is evacuated and then filled with $H_2$. After the SiC wafer is heated to 1000° C. ($T_1$), and kept at the temperature $T_1$ for 30 minutes ($t_1$), with 3L of $H_2$ per minute flowing through the furnace, the wafer is cooled down to room temperature, and taken out of the furnace.

Subsequently, the SiC wafer is inserted into an oxidizing furnace having a temperature of 700° C. ($T_2$), and then heated to 1100° C. ($T_3$) while being exposed to an oxygen ($O_2$) atmosphere. After heating of the wafer, pyrogenic oxidation is conducted at 1100° C. for 5 hours, in an atmosphere in which the flow rates of $H_2$ and $O_2$ are 8L and 4.5 L per minute, respectively, so as to form an oxide film. Then, the wafer is cooled down to 700° C. at a cooling rate of 3° C. per minute, in the same atmosphere as used during formation of the oxide film, and then taken out of the furnace. The thickness of the oxide film grown in this manner is about 30 to 40 nm.

Figure 3:
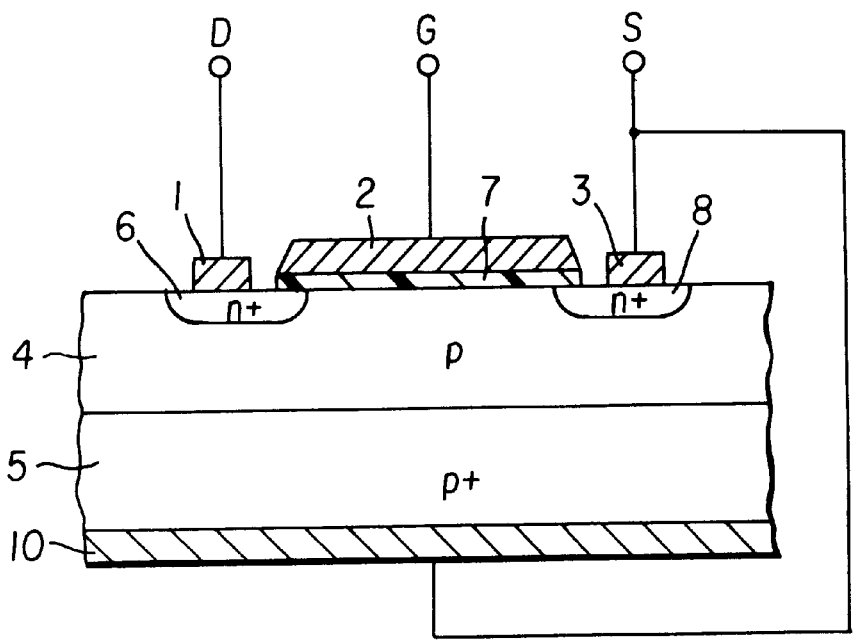
FIG. 3 is a cross-sectional view showing a MOSFET used for measurement of the mobility.

To evaluate the method for forming the oxide film as described above, a lateral MOSFET was fabricated. FIG. 3 is a cross-sectional view of the MOSFET produced with the oxide film formed by the above-described method.

To produce the MOSFET, a p epitaxial layer 4 having a thickness of 5 μm was grown on a p⁺ substrate 5, by doping Al with a carrier concentration of $1\times10^{16}$ cm$^{-3}$, to provide a 4H-SiC wafer with a silicon surface having (0001) plane orientation.

Subsequently, nitrogen ions were implanted into the surface of the p epitaxial layer 4, and heat treatment was conducted at 1300° C. for 30 minutes, to form n⁺ drain region 6 and n⁺ source region 8. The acceleration voltage during ion implantation was 100 kV, the dose amount was $7\times10^{15}$ cm$^{-2}$, and the depth of the junction after heat treatment was about 0.5 μm.

In the next step, a gate oxide film 7 was formed by the method of the present embodiment as described above. Here, the heating of the wafer in the pretreatment furnace was conducted by a high-frequency heating method, and in the oxidizing furnace was conducted by a resistance heating method.

After formation of the gate oxide film 7, a 1 μm-thickness aluminum film was deposited by sputtering, and patterned by photo-etching, to provide a gate electrode 2. The size (W×L) of the gate electrode 2 was 150 μm×100 μm. Also, nickel and aluminum were vapor-deposited and patterned, so as to provide a drain electrode 1 and a source electrode 3 that contact with the n⁺ drain region 6 and n⁺ source region 8, respectively. A rear surface electrode 10 was also formed on the rear surface of the p⁺ substrate 5.

Figure 4:
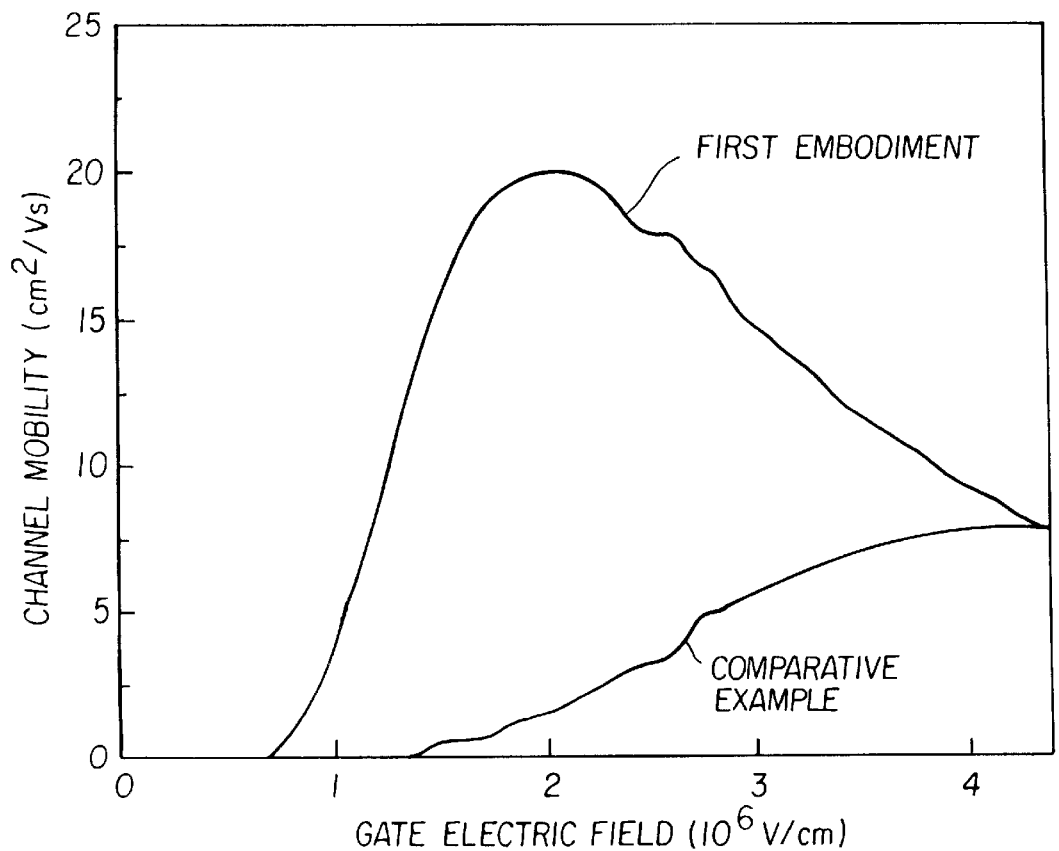
FIG. 4 is a graph showing the channel mobility of the MOSFET produced according to the method of the first embodiment.

FIG. 4 shows the result of measurement of the mobility of the MOSFET as shown in FIG. 3. The horizontal axis indicates an electric field applied to the gate oxide film, and the vertical axis indicates the channel mobility of the MOSFET. For comparison, FIG. 4 also shows the mobility of a MOSFET (Comparative Example) whose gate oxide film was formed by thermal oxidation without conducting the preliminary treatment.

In the MOSFET having the gate oxide film formed according to the method of the present embodiment, the channel mobility rapidly increased while the electric field applied to the gate was still in a low range, and reaches its maximum at around $2\times10^6$ V/cm. Then, the mobility was gradually reduced, to be eventually almost equal to that of the MOSFET of the comparative example at around $5\times10^6$ V/cm.

In the actual operation of MOSFET, the drain current is influenced by an integral value of the mobility up to the moment when the electric field reaches a certain level for driving the gate of the MOSFET, rather than an instantaneous value of the mobility at the relevant electric field. Accordingly, the oxidizing method of the present embodiment yields a great effect since the channel mobility of the MOSFET is rapidly increased in a relatively low range of electric field. For example, if an electric field of about $2\times10^6$V/cm, which is normally applied for driving the gate of MOSFET, is applied to the MOSFET of the present embodiment and the comparative example, the channel mobility of the present MOSFET is twenty times greater than that of the comparative MOSFET, as is apparent from FIG. 4.

Although the mechanism by which the above effect is obtained has not been made clear, the improvement in the mobility may result from etching of an imperfect layer at the surface of the SiC wafer during the preliminary heat treatment in a hydrogen atmosphere, as reported by Tsuchida, H. et al. (Proceedings of International Conference on Silicon Carbide, III-nitrides and Related Materials-1997).

A further experiment was conducted by varying the temperature and time of the preliminary treatment. It was found from the experiment that the above-described effect is observed when the temperature $T_1$ equal to 800° or higher, but etch pits appears on the surface if it exceeds 1200° C. Also, the effect of improving the mobility is observed if the pretreatment time $t_1$ is equal to or longer than 5 minutes, and better results are obtained with an increase in the pretreatment time. However, the above effect tends to be saturated when the pretreatment time is two hours or longer, and therefore increasing the pretreatment time to be longer than two hours only results in an increase in the whole process time, which is undesirable in terms of manufacturing efficiency.

Second Embodiment

In the pretreatment process prior to the oxidation process, 1% of hydrochloric acid gas (hereinafter referred to as "HCl") was added to $H_2$. The temperature and time period of the pretreatment process and the following oxidation process were almost the same as those of the first embodiment.

A lateral MOSFET as shown in FIG. 3 was fabricated in which a gate oxide film was formed by the above-described method, and the channel mobility of the MOSFET was evaluated.

In the MOSFET in which the gate oxide film was formed by the oxide film forming method of the present embodiment, the channel mobility rapidly increased while the electric field applied to the gate was still in a low range, and then gradually decreased after reaching its maximum, in the same fashion as in the first embodiment. Further, the mobility over the entire range of the electric field was higher by about 4% than that of the first embodiment.

When a further experiment was conducted by varying the concentration of HCl, it was found that etch pits appeared on the surface with the HCl concentration in excess of 5%.

Third Embodiment

Figure 2:
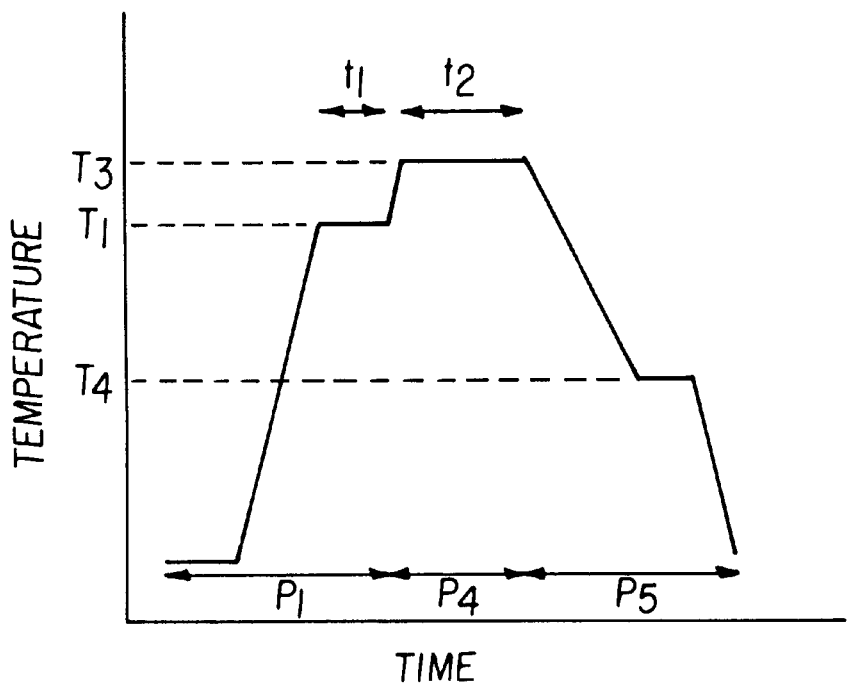
FIG. 2 is a graph representing a temperature program of the second embodiment of the present invention.

FIG. 2 represents a temperature program showing changes in the temperature in another oxidization process according to the present invention, wherein the same furnace is used as a pretreatment furnace in which hydrogen treatment is conducted, and as an oxidizing furnace in which an oxide film is formed. This method will be described in detail below.

A SiC wafer is inserted into an oxidizing furnace at room temperature, and the furnace is evacuated and then filled with $H_2$. The SiC wafer is heated to 1000° C. ($T_1$), and then kept at this temperature $T_1$ for 30 minutes ($t_1$), with 3L of $H_2$ per minute flowing through the furnace. Thereafter, the hydrogen atmosphere is replaced by nitrogen, and then $O_2$, and the temperature of the oxidizing furnace is increased to 1100° C. ($T_3$). In this condition, pyrogenic oxidation is conducted at 1100° C. for 5 hours ($t_3$), in a wet oxygen atmosphere in which the flow rates of $H_2$ and $O_2$ are 8L and 4.5 L per minute, respectively, so as to form an oxide film. Then, the wafer is cooled down to 700° C. at a cooling rate of 3° C. per minute, in the same atmosphere as used in the oxidation step, and then taken out of the furnace. The thickness of the oxide film grown in this manner is about 30 to 40 nm.

In the above-described method, a separate furnace for the hydrogen treatment need not be prepared, and the process is advantageously simplified. Each of the periods $P_1$, $P_4$, $P_5$ has exactly the same meaning as those of FIG. 1, but the periods $P_2$ and $P_3$ are eliminated or omitted in FIG. 2.

A lateral MOSFET as shown in FIG. 3 was fabricated in which a gate oxide film was formed by the above-described oxide film forming method, and the channel mobility of this MOSFET was evaluated.

The MOSFET having the gate oxide film formed by the method of the present embodiment showed exactly the same dependence of the channel mobility on the electric field as the MOSFET of FIG. 3 having the oxide film formed by the method of the first embodiment.

Fourth Embodiment

In the pretreatment process prior to the oxidization process, a mixture of $H_2$ and argon gases, which contains 20% of $H_2$, is used as an atmosphere in the furnace, instead of $H_2$ as used in the third embodiment. The temperature and time of the pretreatment process and the following oxidization process are almost the same as those of the third embodiment.

A lateral MOSFET as shown in FIG. 3 was fabricated in which a gate oxide film was formed by the above-described method, and the channel mobility of the MOSFET was evaluated.

The MOSFET having the gate oxide film formed by the method of the present embodiment showed exactly the same dependence of the channel mobility on the electric field as the MOSFET having the oxide film formed by the method of the third embodiment.

From the above description, it is understood that the use of the mixture of $H_2$ and argon gases that contains 20% of $H_2$ in the pretreatment process yields almost the same effect as provided by using pure $H_2$. From the viewpoint of the safety, it is easier to handle $H_2$ when mixed with inert gas, rather than handing pure $H_2$. If the mixed atmosphere contains 10% of $H_2$, the effect of the pretreatment is significantly attenuated or reduced. Thus, the content of $H_2$ is preferably 20% or greater. Other than argon as indicated above, helium or nitrogen may be used as an inert gas.

While 4H-SiC crystal is used in the illustrated embodiments, the same effect may be obtained by using 6H-SiC crystal that is also alpha-phase SiC in which a zinc-blend structure and a wurtzite structure are superposed on each other in a different order from that of 4H-SiC crystal.

Conventionally, so-called wet oxidation in which pure water is heated so as to cause bubbling of oxygen was often employed as an oxidization method. This method, however, has a problem that drops of water tend to be introduced during bubbling, resulting in contamination of the oxide film. In the illustrated embodiments, therefore, the wafer is subjected to pyrogenic oxidation that is free from the problem of contamination, and has an advantageous feature that $H_2/O_2$ ratio can be easily controlled. It is, however, to be understood that the oxidation method of the present invention is not limited to pyrogenic oxidation, but may be any other oxidizing method, such as wet oxidation and dry oxidation.

In the illustrated embodiments, the SiC wafer is cooled down in a wet oxygen atmosphere, since the use of the atmosphere containing hydrogen in the cooling step is effective to lower the interface state density. It is, however, to be understood that the use of such a cooling atmosphere is not essential to the present invention.

While n channel MOSFET was fabricated, and the channel mobility of the MOSFET was evaluated in the illustrated embodiments, the effect of the present invention can be obtained not only in n channel MOSFET, but equally obtained in p channel MOSFET.

In the method for forming a thermal oxide film of a silicon carbide semiconductor device according to the present invention as explained above, wherein a silicon carbide substrate is heated in an oxidizing atmosphere so as to grow a silicon dioxide film thereon, the silicon carbide substrate is preliminarily treated with hydrogen or a mixture of hydrogen and inert gas, at an elevated temperature in the range of 800 to 1200° C., thereby to significantly improve the channel mobility of the SiC MOS semiconductor device whose gate oxide film is formed by this method. A slight amount of hydrochloric acid gas may be added to the pretreatment atmosphere.

The channel mobility is one of the most important characteristics of MOS type semiconductor devices, and the significant improvement in the channel mobility owing to the present invention is greatly advantageous in practical use of silicon carbide MOS type semiconductor devices.

What is claimed is:

1. A method for forming a thermal oxide film of a silicon carbide semiconductor device, comprising the steps of:

conducting a preliminary treatment in which a silicon carbide substrate is heated in an atmosphere comprising hydrogen; and after said preliminary treatment, heating the silicon carbide substrate in an oxidizing atmosphere so as to grow a silicon dioxide film on a surface of the silicon carbide substrate.

2. The method as defined in claim 1, wherein said atmosphere in which said preliminary treatment is conducted consists of hydrogen.

3. The method as defined in claim 1, wherein said atmosphere in which said preliminary treatment is conducted comprises a mixture of hydrogen gas and inert gas.

4. The method as defined in claim 3, wherein said mixture of hydrogen gas and inert gas contains at least 20% of hydrogen.

5. The method as defined in claim 1, wherein said atmosphere in which the preliminary treatment is conducted further contains a hydrochloric acid gas.

6. The method as defined in claim 5, wherein a content of the hydrochloric acid gas in the atmosphere for the preliminary treatment is controlled to be not greater than 5% of hydrogen.

7. The method as defined in claim 1, wherein said silicon carbide substrate is heated to a temperature in a range of 800 to 1200° C. in said preliminary treatment.

8. The method as defined in claim 1, wherein said silicon carbide substrate is heated for at least five minutes in said preliminary treatment.

9. The method as defined in claim 1, wherein said silicon carbide substrate comprises 4H-SiC crystal.

10. The method as defined in claim 1, wherein said silicon carbide substrate comprises 6H-SiC crystal.

* * * * *